(12) United States Patent
Usui

(10) Patent No.: US 10,453,607 B2
(45) Date of Patent: Oct. 22, 2019

(54) CERAMIC CAPACITOR

(71) Applicant: Murata Manufacturing Co., Ltd., Nagaokakyo-shi, Kyoto-fu (JP)

(72) Inventor: Kazunori Usui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 36 days.

(21) Appl. No.: 15/608,149

(22) Filed: May 30, 2017

(65) Prior Publication Data
US 2017/0345563 A1 Nov. 30, 2017

(30) Foreign Application Priority Data

May 31, 2016 (JP) ................................. 2016-108583

(51) Int. Cl.
| | |
|---|---|
| *H01G 4/002* | (2006.01) |
| *H01G 4/005* | (2006.01) |
| *H01G 4/30* | (2006.01) |
| *H01G 4/228* | (2006.01) |
| *H01G 4/232* | (2006.01) |
| *H01G 4/12* | (2006.01) |
| *H01G 4/012* | (2006.01) |
| *C23C 14/34* | (2006.01) |

(52) U.S. Cl.
CPC .............. *H01G 4/005* (2013.01); *H01G 4/012* (2013.01); *H01G 4/12* (2013.01); *H01G 4/1209* (2013.01); *H01G 4/232* (2013.01); *H01G 4/30* (2013.01); *H01G 4/302* (2013.01); *C23C 14/34* (2013.01); *H01G 4/306* (2013.01)

(58) Field of Classification Search
CPC ........ H01G 4/2325; H01G 4/228; H01G 4/30; H01G 4/005; H01G 4/002; H01G 4/232

USPC .... 361/306.1, 321.3, 321.2, 303, 306.3, 310
See application file for complete search history.

(56) References Cited

U.S. PATENT DOCUMENTS

| | | | | |
|---|---|---|---|---|
| 4,590,537 | A | * 5/1986 | Sakamoto | ................ H01G 4/35 361/306.3 |
| 6,445,593 | B1 | 9/2002 | Okuyama | |
| 2008/0100987 | A1 | * 5/2008 | Togashi | ................ H01G 4/005 361/301.4 |
| 2008/0186652 | A1 | * 8/2008 | Lee | ........................ H01G 4/012 361/306.3 |

(Continued)

FOREIGN PATENT DOCUMENTS

| | | |
|---|---|---|
| JP | 2001-057311 A | 2/2001 |
| JP | 2001-102243 A | 4/2001 |

(Continued)

OTHER PUBLICATIONS

Shimada, "Ceramic Capacitor," U.S. Appl. No. 15/608,126, filed May 30, 2017.

(Continued)

*Primary Examiner* — Eric W Thomas
*Assistant Examiner* — Arun Ramaswamy
(74) *Attorney, Agent, or Firm* — Keating & Bennett, LLP

(57) ABSTRACT

A ceramic capacitor which is low in ESL and suitable for being built into a substrate has a dimension in a length direction of a lowermost surface of a third external electrode which is in contact with a capacitor main body denoted by e1 and a dimension in the length direction of the uppermost surface of the third external electrode denoted by e2, and a relationship of e1<e2 is satisfied.

20 Claims, 10 Drawing Sheets

(56) References Cited

U.S. PATENT DOCUMENTS

| | | | | |
|---|---|---|---|---|
| 2011/0290542 A1* | 12/2011 | Nishisaka | .............. | H01G 4/232 |
| | | | | 174/257 |
| 2013/0258546 A1* | 10/2013 | Kim | ......................... | H01G 4/12 |
| | | | | 361/301.4 |
| 2015/0114702 A1* | 4/2015 | Lee | ......................... | H01G 2/065 |
| | | | | 174/260 |

FOREIGN PATENT DOCUMENTS

| | | | |
|---|---|---|---|
| JP | 2001-155962 A | | 6/2001 |
| JP | 2002367852 A | * | 12/2002 |
| JP | 2009-147177 A | | 7/2009 |
| JP | 2012-114457 A | | 6/2012 |
| JP | 2015-019081 A | | 1/2015 |

OTHER PUBLICATIONS

Asai, "Ceramic Capacitor," U.S. Appl. No. 15/607,762, filed May 30, 2017.
Usui, "Ceramic Capacitor," U.S. Appl. No. 15/607,763, filed May 30, 2017.
Tanaka, "Ceramic Capacitor," U.S. Appl. No. 15/607,767, filed May 30, 2017.
Official Communication issued in corresponding Korean Patent Application No. 10-2017-0065922, dated Aug. 16, 2018.

* cited by examiner

CERAMIC CAPACITOR

CROSS REFERENCE TO RELATED APPLICATIONS

This application claims the benefit of priority to Japanese Patent Application No. 2016-108583 filed on May 31, 2016. The entire contents of this application are hereby incorporated herein by reference.

BACKGROUND OF THE INVENTION

1. Field of the Invention

The present invention relates to a ceramic capacitor.

2. Description of the Related Art

In recent years, the demand for miniaturization and thinning of information terminal devices such as mobile phones and mobile music players is increasing. Associated with this, downsizing is also increasingly required in substrates to be installed in electronic devices and electronic components to be installed in substrates. High density mounting of electronic components to be mounted on a substrate is also increasingly required. In order to further downsize electronic components, a built-in electronic component substrate in which an electronic component is embedded has been developed (e.g., Japanese Patent Application Laid-Open No. 2012-114457). In the built-in electronic component substrate, the electronic component-embedded in the substrate needs to be surely electrically connected to a wiring formed on the substrate.

Further, in a situation in which information amounts of electronic devices are increasing, frequency of usage of electronic devices in a further high-frequency area has increased. Therefore, there is a desire of making it possible to use the built-in electronic component substrate in a high-frequency area by reducing an equivalent series inductance (ESL) of an electronic component built in the built-in electronic component substrate.

For example, Japanese Patent Application Laid-Open No. 2001-155962 and Japanese Patent Application Laid-Open No. 2001-102243 suggest a multi-terminal capacitor such as three-terminal capacitor to reduce ESL. However, the multi-terminal capacitors described in Japanese Patent Application Laid-Open No. 2001-155962 and Japanese Patent Application Laid-Open No. 2001-102243 do not consider embedding in a substrate and electrical connection to wirings formed on the substrate. Therefore, it is difficult to suitably embed the multi-terminal capacitors described in Japanese Patent Application Laid-Open No. 2001-155962 and Japanese Patent Application Laid-Open No. 2001-102243 in a substrate. In other words, multi-terminal capacitors described in Japanese Patent Application Laid-Open No. 2001-155962 and Japanese Patent Application Laid-Open No. 2001-102243 are not suitable for being embedded in a substrate.

In the ceramic capacitor to be built into a substrate, there is a problem that adhesion to a substrate is generally low. When an adhesion force between the ceramic capacitor and a resin constituting a substrate is low, the ceramic capacitor is peeled off from a resin constituting the substrate, and there is a possibility that, due to moisture infiltrating from a peeled portion into the substrate, the reliability of the ceramic capacitor is deteriorated or a joint of the via hole electrode and the external electrode of the ceramic capacitor is ruptured.

SUMMARY OF THE INVENTION

Accordingly, preferred embodiments of the present invention provide a ceramic capacitor which is low in ESL and is suitable for being built into a substrate.

A ceramic capacitor according to a preferred embodiment of the present invention includes a capacitor main body, a plurality of internal electrodes, and a plurality of external electrodes. The capacitor main body includes first and second principal surfaces, first and second side surfaces, and first and second end surfaces. The first and second principal surfaces extend in a length direction and a width direction perpendicular or substantially perpendicular the length direction. The first and second side surfaces extend in the length direction and a laminating direction perpendicular or substantially perpendicular each of the length direction and the width direction. The first and second end surfaces extend in the width direction and the laminating direction. A plurality of internal electrodes are disposed in the capacitor main body. The plurality of internal electrodes are exposed at each of the first and second side surfaces. A plurality of external electrodes extend from exposed portions of the internal electrodes at the first side surface and exposed portions of the internal electrodes at the second side surface to the first and second principal surfaces. A plurality of internal electrodes include first internal electrodes and second internal electrodes. The second internal electrodes are opposed to the first internal electrodes in the laminating direction. A plurality of external electrodes include a first external electrode, a second external electrode and a third external electrode. The first external electrode is connected to the first internal electrodes. The first external electrode wraps around the first side surface, the first principal surface, the second side surface, and the second principal surface. The second external electrode is connected to the first internal electrode. The second external electrode wraps around the first side surface, the first principal surface, the second side surface, and the second principal surface. The third external electrode is connected to the second internal electrodes. The third external electrode wraps around the first side surface, the first principal surface, the second side surface, and the second principal surface. The third external electrode is located between the first external electrode and the second external electrode in the length direction.

In a ceramic capacitor according to a preferred embodiment of the present invention, when a dimension in the length direction of the lowermost surface of the third external electrode which is in contact with the capacitor main body is denoted by e1 and a dimension in the length direction of the uppermost surface of the third external electrode is denoted by e2, a relationship of e1<e2 preferably is satisfied.

In a ceramic capacitor according to a preferred embodiment of the present invention, the relationship of e1<e2 preferably is satisfied. Therefore, defective connection to a via hole electrode in building a ceramic capacitor according to a preferred embodiment of the present invention in a substrate and short-circuiting due to electromigration are significantly reduced or prevented. Accordingly, a ceramic capacitor according to a preferred embodiment of the present invention is suitable to be built into a substrate.

Further, in a ceramic capacitor according to a preferred embodiment of the present invention, by including a configuration in which all of extended portions of the first and second internal electrodes are extended to the first and second side surfaces of the capacitor main body, a distance between the extended portion of the first internal electrode and the extended portion of the second internal electrode is able to be reduced. For this reason, the path length of a current flow is able to be reduced in the ceramic capacitor. Accordingly, a ceramic capacitor according to a preferred embodiment of the present invention has a low equivalent series inductance (ESL).

In a ceramic capacitor according to a preferred embodiment of the present invention, each of the first and second external electrodes does not have to be disposed on the first and second end surfaces. When a dimension in the length direction of the lowermost surface of the first external electrode which is in contact with the capacitor main body is denoted by e3 and a dimension in the length direction of the uppermost surface of the first external electrode is denoted by e4, it is preferred that a relationship of e3<e4 is satisfied. When a dimension in the length direction of the lowermost surface of the second external electrode which is in contact with the capacitor main body is denoted by e5 and a dimension in the length direction of the uppermost surface of the second external electrode is denoted by e6, it is preferred that a relationship of e5<e6 is satisfied.

In a ceramic capacitor according to a preferred embodiment of the present invention, the first internal electrode may have a first opposed portion opposed to the second internal electrode; first and second extended portions connected to the first opposed portion, and each extended to the first side surface and connected to the first external electrode; and third and fourth extended portions connected to the first opposed portion, and each extended to the second side surface and connected to the second external electrode. The second internal electrode may include a second opposed portion opposed to the first opposed portion; a fifth extended portion connected to the second opposed portion, extended to the first side surface and connected to the third external electrode; and a sixth extended portion connected to the second opposed portion, extended to the second side surface and connected to the third external electrode.

In a ceramic capacitor according to a preferred embodiment of the present invention, the outermost layer of each of the first, second and third external electrodes preferably includes a Cu plated layer.

In a ceramic capacitor according to a preferred embodiment of the present invention, each of (e2−e1), (e4−e3) and (e6−e5) is preferably about 24 µm or less, for example.

In a ceramic capacitor according to a preferred embodiment of the present invention, the first external electrode preferably includes a first portion extending from a portion located on the first principal surface to a portion of the first end surface, a second portion extending from a portion located on the second principal surface to a portion of the first end surface, a third portion extending from a portion located on the first side surface to a portion of the first end surface, and a fourth portion extending from a portion located on the second side surface to a portion of the first end surface. The second external electrode preferably includes a fifth portion extending from a portion located on the first principal surface to a portion of the second end surface, a sixth portion extending from a portion located on the second principal surface to a portion of the second end surface, a seventh portion extending from a portion located on the first side surface to a portion of the second end surface, and an eighth portion extending from a portion located on the second side surface to a portion of the second end surface. Lengths of the first and second portions, and of the fifth and sixth portions in the laminating direction are preferably each about 5% or more and about 15% or less of a dimension of the ceramic capacitor in the laminating direction. Lengths of the third and fourth portions, and of the seventh and eighth portions in the laminating direction are preferably each about 5% or more and about 15% or less of a width dimension of the ceramic capacitor.

In a ceramic capacitor according to a preferred embodiment of the present invention, respective lengths of the first, second, fifth, and sixth portions in the laminating direction may be smaller than lengths of the third, fourth, seventh, and eighth portions in the width direction.

In a ceramic capacitor according to a preferred embodiment of the present invention, a length of a portion of the third external electrode located on the first or second principal surface in the length direction may be larger than a length of a portion of the third external electrode located on the first or second side surface in the length direction.

In a ceramic capacitor according to a preferred embodiment of the present invention, a length of a portion of the first external electrode located on the first or second principal surface in the length direction may be larger than a length of a portion of the first external electrode located on the first and second side surfaces in the length direction. A length of a portion of the second external electrode located on the first or second principal surface in the length direction may be larger than a length of a portion of the second external electrode located on the first and second side surfaces in the length direction.

In a ceramic capacitor according to a preferred embodiment of the present invention, when a maximum length in the length direction, of portions of the first and second external electrodes located on the first or second principal surface, is denoted by L1, whereas a maximum length of the first and second external electrodes in the length direction from a portion farthest from the capacitor main body in the laminating direction, of the portions of the first and second external electrodes located on the first or second principal surface, to a portion recessed to the capacitor main body by about 40% of a thickness of the first or second external electrode in the laminating direction is denoted by L2, a ratio L2/L1 is preferably about 80% or more and about 90% or less, for example. When a maximum length in the length direction, of a portion of the third external electrode located on the first or second principal surface, is denoted by L3, whereas a maximum length in the length direction from a portion farthest from the capacitor main body in the laminating direction, of the portion of the third external electrode located on the first or second principal surface, to a portion recessed to the capacitor main body by about 40% of a thickness of the third external electrode in the laminating direction is denoted by L4, a ratio L4/L3 is preferably about 80% or more, for example.

According to various preferred embodiments of the present invention, ceramic capacitors are low in ESL and suitable for being built into a substrate.

The above and other elements, features, steps, characteristics and advantages of the present invention will become more apparent from the following detailed description of the preferred embodiments with reference to the attached drawings.

DETAILED DESCRIPTION OF THE PREFFERED EMBODIMENTS

Hereinafter, examples of preferred embodiments of the present invention will be described. However, the following preferred embodiments are merely examples. The present invention is not limited to the following preferred embodiments at all.

Further, in drawings referred to in the description of preferred embodiments or the like, substantially like members in functions are denoted by like symbols. Further, the drawings referred to in the description of preferred embodiments or the like are schematically shown. The dimensional ratios and the like of an object pictured in a drawing may be different from that of a real object. The dimensional ratios and the like of an object may differ between drawings. The dimensional ratios and the like of specific objects have to be determined in consideration of the following description.

Figure 1:
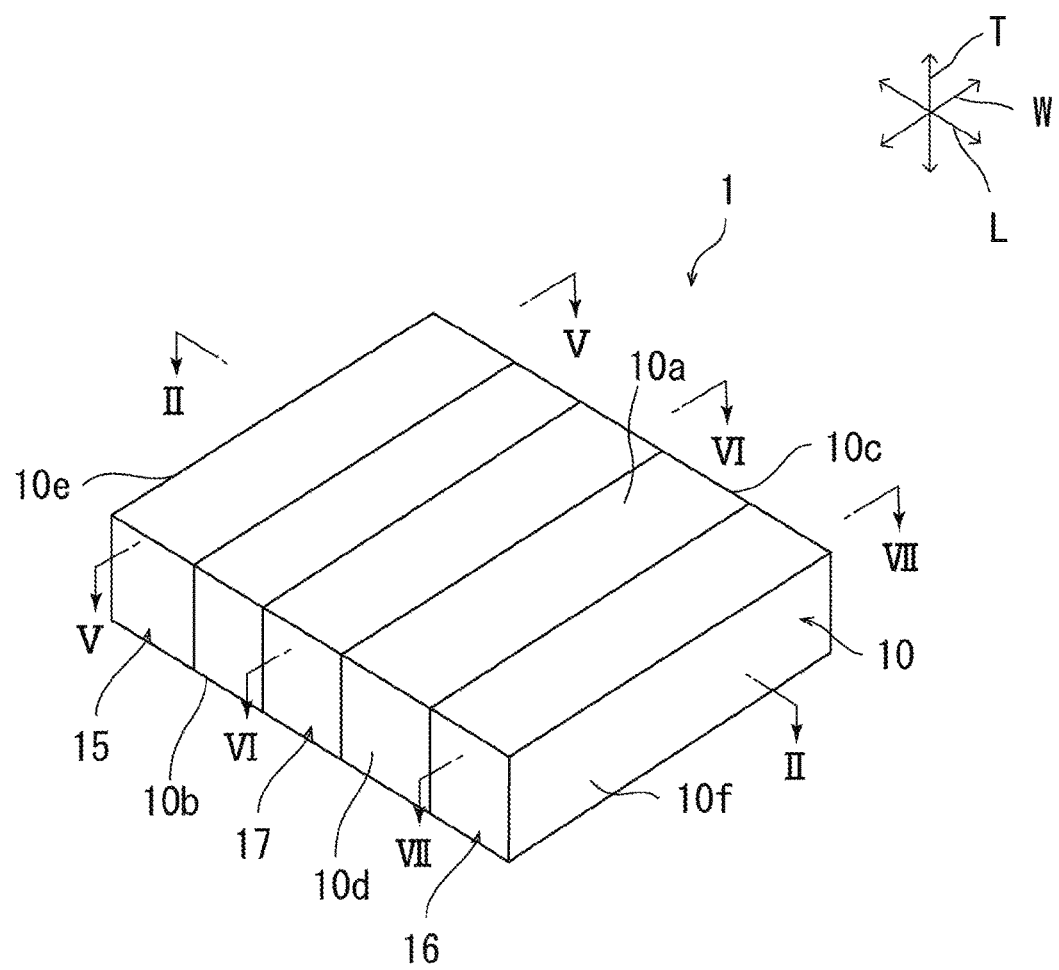
FIG. 1 is a schematic perspective view of a capacitor of a first preferred embodiment of the present invention.
Figure 2:
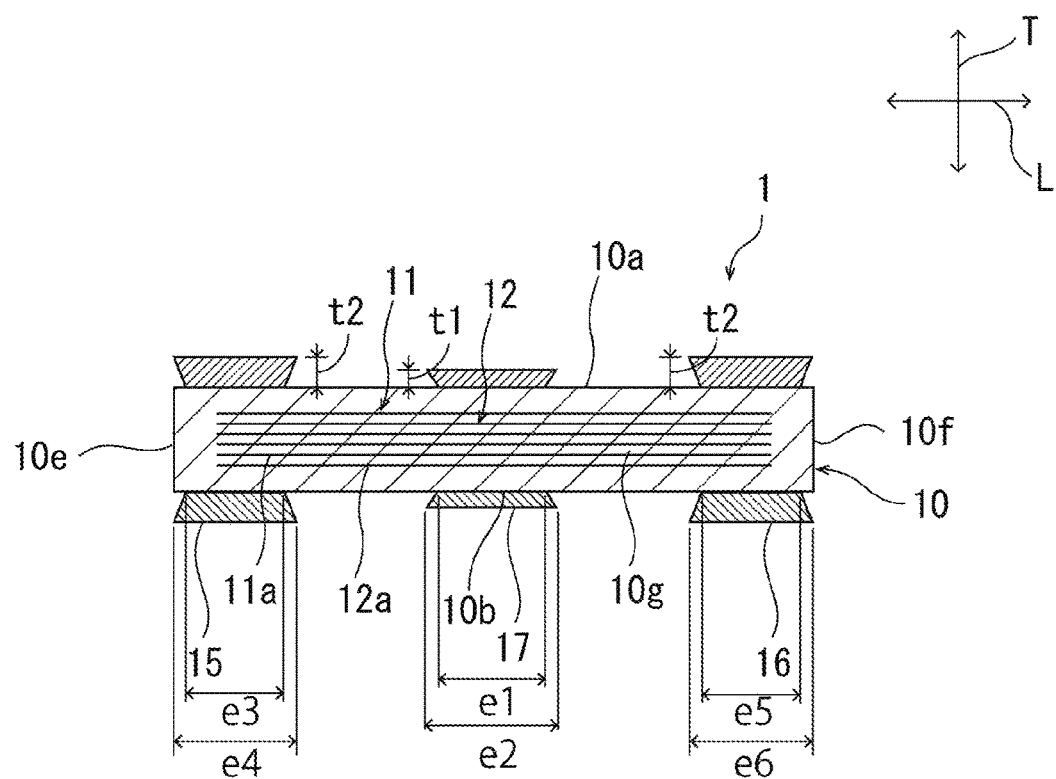
FIG. 2 is a schematic cross-sectional view taken on line II-II of FIG. 1.
Figure 3:
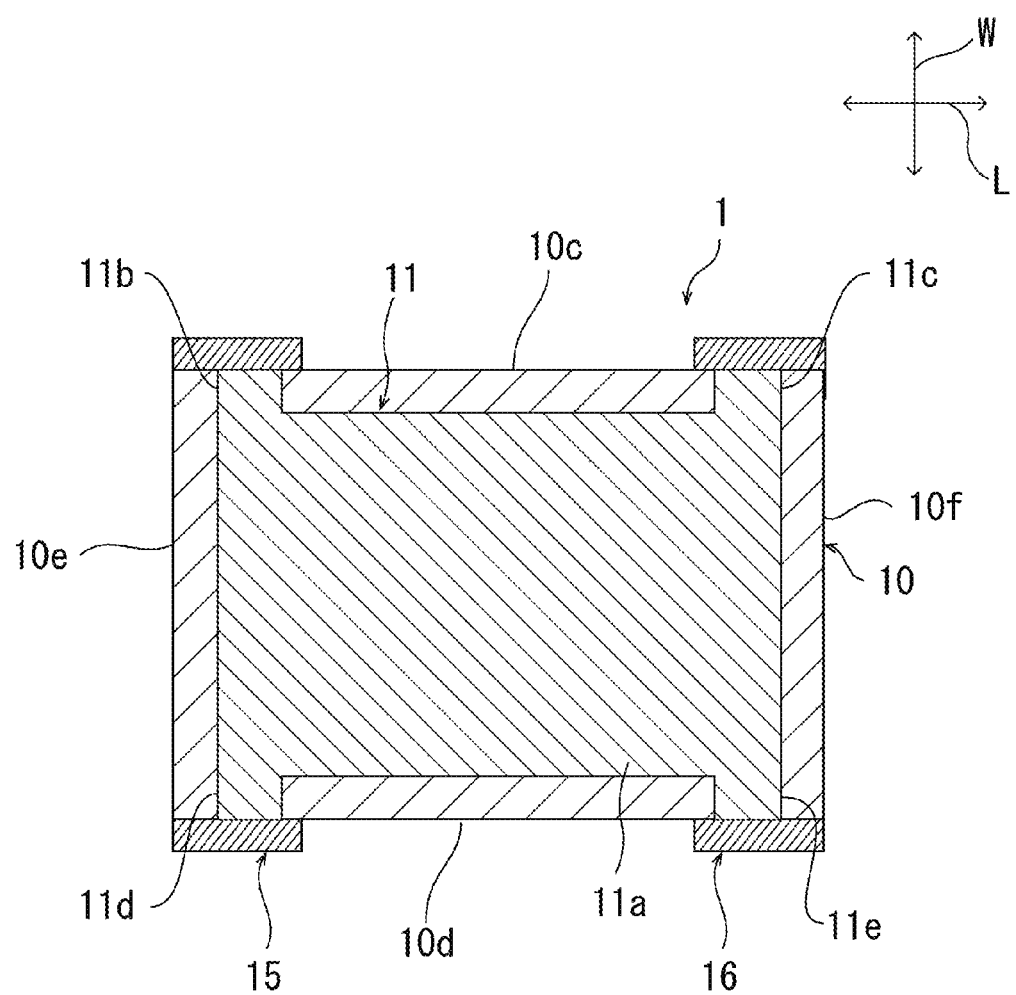
FIG. 3 is a schematic cross-sectional view of the capacitor of the first preferred embodiment of the present invention.
Figure 4:
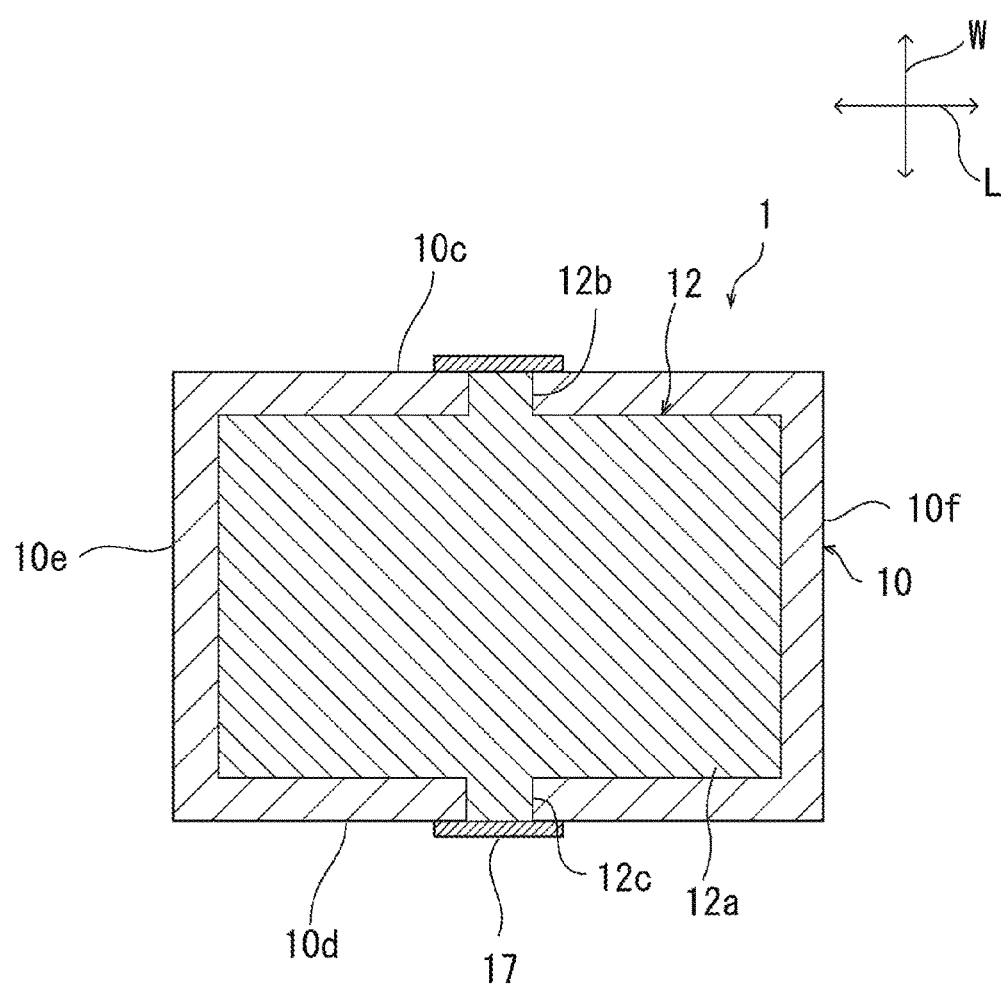
FIG. 4 is a schematic cross-sectional view of the capacitor of the first preferred embodiment of the present invention.
Figure 5:
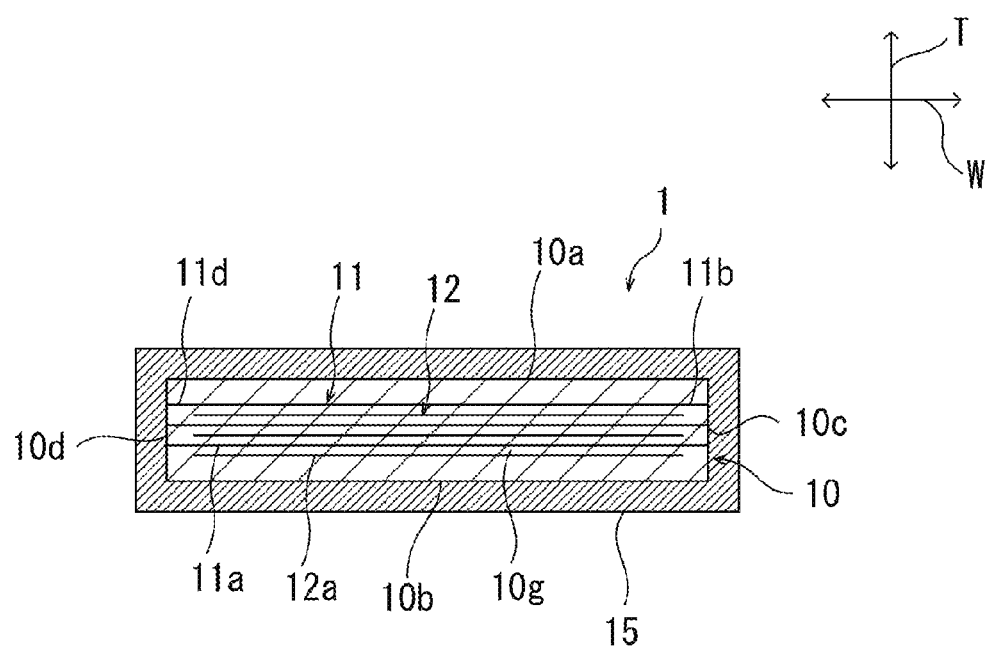
FIG. 5 is a schematic cross-sectional view taken on line V-V of FIG. 1.
Figure 6:
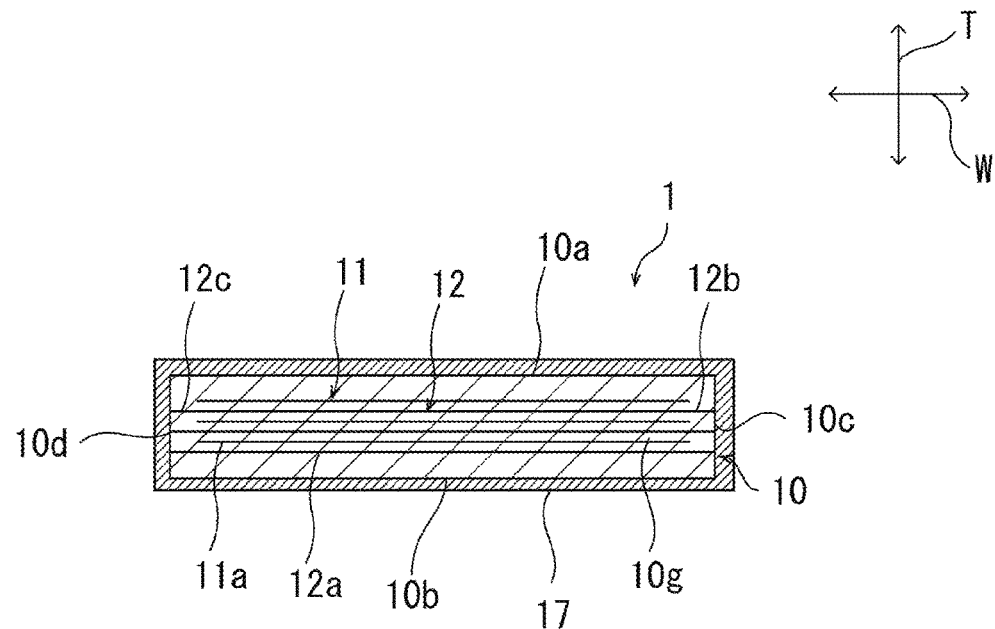
FIG. 6 is a schematic cross-sectional view taken on line VI-VI of FIG. 1.
Figure 7:
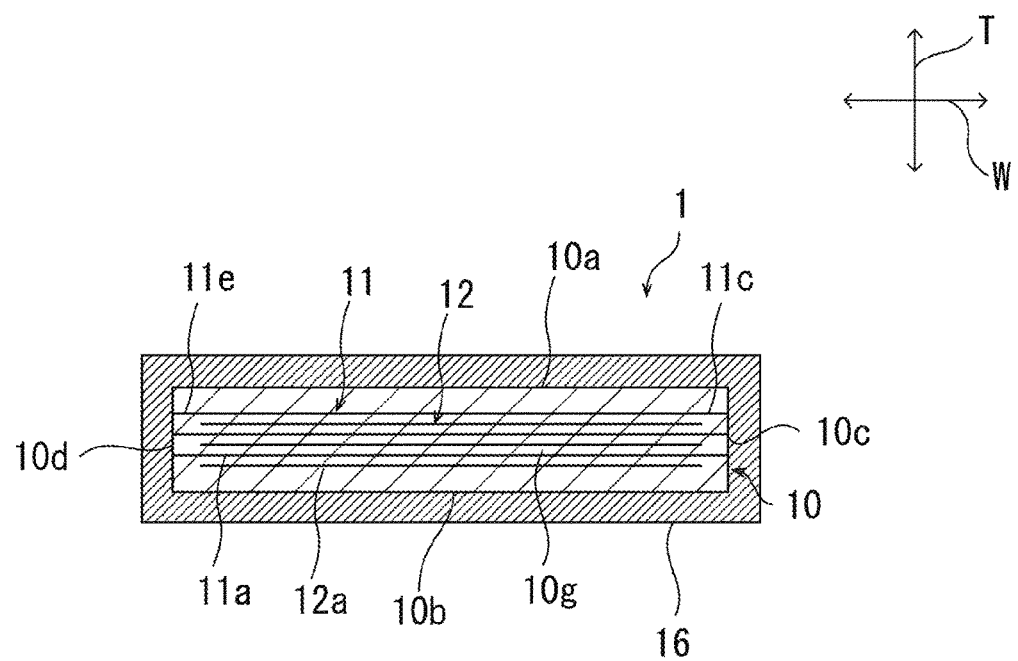
FIG. 7 is a schematic cross-sectional view taken on line VII-VII of FIG. 1.
Figure 8:
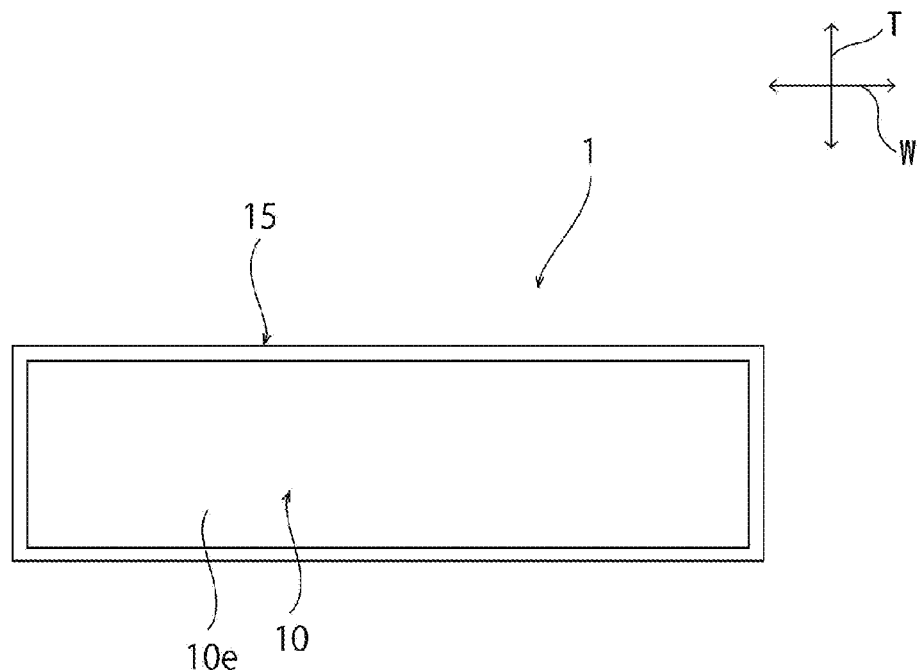
FIG. 8 is a schematic plan view of a first end surface of the capacitor of a first preferred embodiment of the present invention.
Figure 9:
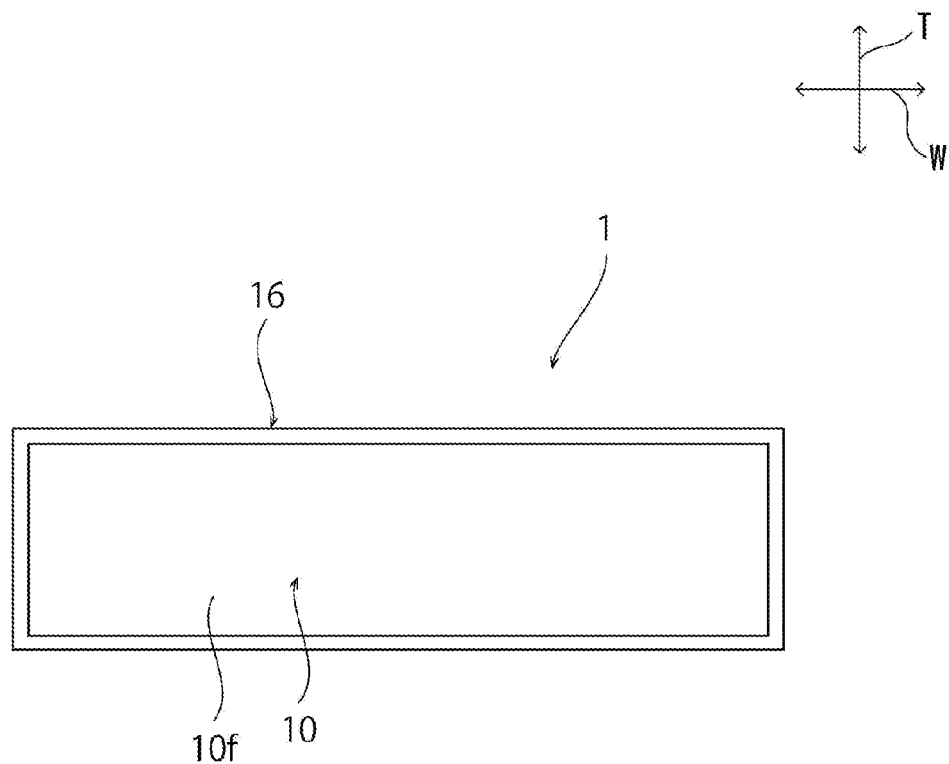
FIG. 9 is a schematic plan view of a second end surface of the capacitor of the first preferred embodiment of the present invention.

FIG. 1 is a schematic perspective view of a capacitor of the present preferred embodiment; FIG. 2 is a schematic cross-sectional view taken on line II-II of FIG. 1. FIG. 3 is a schematic cross-sectional view of the capacitor of the first preferred embodiment in a length direction L and a width direction W. FIG. 4 is a schematic cross-sectional view of the capacitor of the first preferred embodiment in the length direction L and the width direction W. In addition, FIGS. 3 and 4 are each a schematic cross-sectional view of sites separate in the laminating direction T. FIG. 5 is a schematic cross-sectional view taken on line V-V of FIG. 1. FIG. 6 is a schematic cross-sectional view taken on line VI-VI of FIG. 1. FIG. 7 is a schematic cross-sectional view taken on line VII-VII of FIG. 1. FIG. 8 is a schematic plan view of a first end surface of the capacitor of the present preferred embodiment. FIG. 9 is a schematic plan view of a second end surface of the capacitor of the present preferred embodiment.

As shown in FIGS. 1 to 7, the ceramic capacitor 1 includes a capacitor main body 10. The capacitor main body 10 preferably has a cuboid or substantially cuboid shape. The capacitor main body 10 includes first and second principal surfaces 10a, 10b, first and second side surfaces 10c, 10d, and first and second end surfaces 10e, 10f. The first and second principal surfaces 10a, 10b each extend in a length direction L and a width direction W. The length direction L is a direction connecting the first end surface 10e and the second end surface 10f. The width direction W is perpendicular or substantially perpendicular the length direction L. The width direction W is a direction connecting the first side surface 10c and the second side surface 10d. The first and second side surfaces 10c, 10d each extend in the length direction L and the laminating direction T. The laminating direction T is a direction connecting the first principal surface 10a and the second principal surface 10b. The laminating direction T is perpendicular or substantially perpendicular each of the length direction L and the width direction W. The first and second end surfaces 10e, 10f each extend in the width direction W and the laminating direction T. Ridges and corners of the capacitor main body 10 may be chamfered or may be rounded; however, the capacitor main body 10 preferably includes ridges and corners rounded from the viewpoint of preventing the occurrence of cracks.

The capacitor main body 10 is configured by appropriate dielectric ceramic. The capacitor main body 10 may be specifically configured by dielectric ceramic including, for example, $BaTiO_3$, $CaTiO_3$, $SrTiO_3$, or $CaZrO_3$. A Mn compound, an Fe compound, a Cr compound, a Co compound, a Ni compound or the like may be added to the capacitor main body 10.

A dimension of the capacitor main body 10 is not particularly limited; however, when a height dimension, a length dimension and a width dimension of the capacitor main body 10 are denoted by DT, DL and DW, respectively, it is preferred that the relationship of DT<DW<DL, (about ½)DW≤DT≤(about ⅓)DW or DT<about 0.25 mm is satisfied, for example. Specifically, it is preferred that the relationship of about 0.05 mm≤DT<about 0.25 mm, about 0.4 mm≤DL≤about 1 mm, and about 0.3 mm≤DW≤about 0.5 mm is satisfied, for example. As described above, since a dimension along the laminating direction of the ceramic capacitor of the present preferred embodiment is small, the ceramic capacitor 1 is suitable for being built into a substrate. However, when the dimension along the laminating direction of the ceramic capacitor 1 is too small, a capacitance of the ceramic capacitor 1 may be too small, or strength of the ceramic capacitor 1 may be too low. Accordingly, the dimension along the laminating direction of the ceramic capacitor 1 is preferably about ⅕ times or more, and more preferably about ½ times or more as large as the width dimension, for example.

Further, the dimensions of the ceramic capacitor 1 can be measured with use of a micrometer or a microscope.

As shown in FIG. 2, a plurality of internal electrodes 11, 12 are disposed within the capacitor main body 10. Specifically, a plurality of the first external electrodes 11 and a plurality of the second external electrodes 12 are alternately disposed along the laminating direction T in the capacitor main body 10. The first internal electrode 11 and the second internal electrode 12 adjacent to each other in the laminating direction T are opposed with the ceramic portion 10g interposed therebetween. Thus, a capacitance is generated. In addition, the ceramic portion 10g is preferably about 0.5 μm or more and about 10 μm or less in thickness, for example.

As shown in FIG. 3, the first internal electrode 11 is exposed at each of the first side surface 10c and the second side surface 10d. Specifically, the first internal electrodes 11 has the opposed portion 11a, the first extended portion 11b, the second extended portion 11c, the third extended portion 11d, and the fourth extended portion 11e.

The opposed portion 11a is opposed to the second internal electrode 12 in the laminating direction T. The opposed portion 11a is preferably rectangular or substantially rectangular, for example.

The first extended portion 11b is connected to the opposed portion 11a. The first extended portion 11b is extended to the first side surface 10c. Specifically, the first extended portion 11b extends from a corner on a first side surface 10c side and a first end surface 10e side of the opposed portion 11a toward the first side surface 10c.

The second extended portion 11c is connected to the opposed portion 11a. The second extended portion 11c is extended to the first side surface 10c. Specifically, the second extended portion 11c extends from a corner on a first side surface 10c side and a second end surface 10f side of the opposed portion 11a toward the first side surface 10c. The first extended portion 11b is connected to one end in the length direction L of the opposed portion 11a, and the second extended portion 11c is connected to the other end in the length direction L of the opposed portion 11a.

The third extended portion 11d is connected to the opposed portion 11a. The third extended portion 11d is extended to the second side surface 10d. Specifically, the third extended portion 11d extends from a corner on a second side surface 10d side and a first end surface 10e side of the opposed portion 11a toward the second side surface 10d.

The fourth extended portion 11e is connected to the opposed portion 11a. The fourth extended portion 11e is extended to the second side surface 10d. Specifically, the fourth extended portion 11e extends from a corner on a second side surface 10d side and a second end surface 10f side of the opposed portion 11a toward the second side surface 10d. The third extended portion 11d is connected to one end in the length direction L of the opposed portion 11a, and the fourth extended portion 11e is connected to the other end in the length direction L of the opposed portion 11a.

As shown in FIG. 4, the second internal electrode 12 is exposed at each of the first and second side surfaces 10c, 10d. Specifically, the second internal electrode 12 includes the opposed portion 12a, the fifth extended portion 12b, and the sixth extended portion 12c.

The opposed portion 12a is opposed to the opposed portion 11a of the first internal electrode 11 in the laminating direction T. The opposed portion 12a preferably is substantially rectangular, for example.

The fifth extended portion 12b is connected to the opposed portion 12a. The fifth extended portion 12b is extended to the first side surface 10c. The fifth extended portion 12b is located between the first extended portion 11b and the second extended portion 11c in the length direction L. The fifth extended portion 12b extends from nearly a center of the opposed portion 12a toward the first side surface 10c in the length direction L.

The sixth extended portion 12c is connected to the opposed portion 12a. The sixth extended portion 12c is extended to the second side surface 10d. The sixth extended portion 12c is located between the third extended portion 11d and the fourth extended portion 11e in the length direction L. The sixth extended portion 12c extends from nearly a center of the opposed portion 12a toward the second side surface 10d in the length direction L.

In addition, widths of the extended portions 11b, 11c, 11d, 11e, 12b, and 12c can be each, for example, about 50 μm or more and about 100 μm or less.

As described above, by including a configuration in which all of extended portions 11b, 11c, 11d, 11e, 12b, 12c of the internal electrodes 11, 12 are extended to the first and second side surfaces of the capacitor main body 10, each distance between the extended portions 11b, 11c, 11d, 11e of the first internal electrode 11 and the extended portions 12b, 12c of the second internal electrode 12 is able to be reduced. For this reason, the path length of a current flow is able to be reduced in the ceramic capacitor 1. Accordingly, the equivalent series inductance (ESL) of the ceramic capacitor 1 is able to be reduced.

The first and second internal electrodes 11, 12 can be, for example, about 0.2 μm or more and 2 about μm or less in thickness.

The first and second internal electrodes 11, 12 can be made of appropriate conductive materials. Each of the first and second internal electrodes can be composed of, for example, metal such as Ni, Cu, Ag, Pd or Au, or an alloy including one of these metals such as an Ag—Pd alloy.

As shown in FIG. 1, the ceramic capacitor 1 includes a plurality of external electrodes 15, 16, 17. Specifically, the ceramic capacitor 1 includes a first external electrode 15, a second external electrode 16, and a third external electrode 17.

The first external electrode 15 extends from an exposed portion of the first extended portion 11b of the first internal electrode 11 at the first side surface 10c and from an exposed portion of the third extended portion 11d of the first internal electrode 11 at the second side surface 10d so as to extend over the first and second principal surfaces 10a, 10b. Specifically, the first external electrode 15 covers exposed portions of the first extended portion 11b and the third extended portion 11d and wraps around the first side surface 10c, the first principal surface 10a, the second side surface 10d and the second principal surface 10b. In the present preferred embodiment, the first external electrode 15 is disposed on the first and second principal surfaces 10a, 10b and on the first and second side surfaces 10c, 10d, and is not disposed on the first and second end surfaces 10e, 10f. A width of the first external electrode 15 is preferably about 190 μm or more and about 270 μm or less, for example.

The second external electrode 16 extends from an exposed portion of the second extended portion 11c of the first internal electrode 11 at the first side surface 10c and from an exposed portion of the fourth extended portion 11e of the first internal electrode 11 at the second side surface 10d so as to extend over the first and second principal surfaces 10a, 10b. Specifically, the second external electrode 16 covers exposed portions of the second extended portion 11c and the fourth extended portion 11e and wraps around the first side surface 10c, the first principal surface 10a, the second side surface 10d and the second principal surface 10b. In the present preferred embodiment, the second external electrode 16 is disposed on the first and second principal surfaces 10a, 10b and on the first and second side surfaces 10c, 10d, and is not disposed on the first and second end surfaces 10e, 10f. A width of the second external electrode 16 is preferably about 190 μm or more and about 270 μm or less, for example.

The first external electrode 15 is disposed at one end in the length direction L of the capacitor main body 10, and the second external electrode 16 is disposed at the other end in the length direction L of the capacitor main body 10.

The third external electrode 17 is disposed between the first external electrode 15 and the second external electrode 16 in the length direction L. The third external electrode 17 extends from an exposed portion of the fifth extended portion 12b of the second internal electrode 12 at the first side surface 10c and from an exposed portion of the sixth extended portion 12c of the second internal electrode 12 at the second side surface 10d so as to extend over the first and second principal surfaces 10a, 10b. Specifically, the third external electrode 17 covers exposed portions of the fifth extended portion 12b and the sixth extended portion 12c and so as to wrap around the first side surface 10c, the first principal surface 10a, the second side surface 10d and the second principal surface 10b. A width of the third external electrode 17 is preferably about 240 µm or more and about 320 µm or less, for example. A distance between the third external electrode 17 and the first external electrode 15 or the second external electrode 16 in the length direction L is preferably about 70 µm or more, for example.

As described above, the first, second and third external electrodes 15, 16, 17 each wrap around the capacitor main body 10, and therefore areas of the external electrodes 15 to 17 are adequately secured, and via holes to face the external electrodes 15 to 17 of the ceramic capacitor 1 embedded in a substrate are able to be easily formed. Further, since it becomes possible to have continuity between a plurality of via hole electrodes and each of the external electrodes 15 to 17, wiring resistance between a substrate and the ceramic capacitor 1 are able to be reduced. Accordingly, it becomes possible to further reduce the ESL.

The outermost layer of each of the first, second and third external electrodes 15, 16, 17 preferably is a Cu plated layer.

The first, second and third external electrodes 15, 16, 17 can be, for example, a laminated body of a base electrode layer, a thin-film electrode layer and a Cu plated layer.

The base electrode layer preferably includes at least one selected from, for example, the group consisting of Cu, Ni, Ag, Pd, an Ag—Pd alloy and Au. The base electrode layer may be fired concurrently with the capacitor main body 10 including the internal electrodes 11, 12, or after firing the capacitor main body 10 including the internal electrodes 11, 12, a conductive past may be applied and fired to form the base electrode layer. Alternatively, the base electrode layer may be formed by plating, or formed by curing a conductive resin including a thermosetting resin. The base electrode layer preferably further includes an inorganic binding material. The inorganic binding material enhances the adhesion strength to the capacitor main body 10. When the base electrode layer is fired concurrently with the capacitor main body 10 including the internal electrodes 11, 12 and formed, the inorganic binding material is also referred to as a common material. In this case, the inorganic binding material is preferably, for example, the same ceramic material as a ceramic material contained in the capacitor main body 10. Also, the inorganic binding material may be, for example, a ceramic material whose principal component is the same as a ceramic material contained in the capacitor main body 10. Further, the inorganic binding material of the base electrode layer may be, for example, a glass component.

The base electrode layer is provided on the exposed portions of the internal electrodes 11, 12 at the first and second side surfaces 10c, 10d of the capacitor main body 10. In addition, the base electrode layer is not only provided on the exposed portions of the internal electrodes 11, 12 on the first and second side surfaces 10c, 10d, but also may be extended to ridges at which the first and second principal surfaces 10a, 10b and the first and second side surfaces 10c, 10d of the capacitor main body 10 intersect, and may be provided on a portion of the principal surfaces 10a, 10b of the capacitor main body 10. In the present preferred embodiment, the first external electrode 15 and the second external electrode 16 are not disposed on ridges at which the first and second principal surfaces 10a, 10b and the first and second end surfaces 10e, 10f intersect, and on the first and second end surfaces 10e, 10f. As a result of this, a surface area of the capacitor main body 10 which has a high adhesion force to a resin of a substrate can be large. Accordingly, the adhesion between the substrate and the ceramic capacitor 1 is improved.

The maximum thickness of the base electrode layer is preferably about 1 µm or more, for example.

In the present preferred embodiment, the thin film electrode layers are disposed on the base electrode layer and on the first and second principal surfaces 10a, 10b. The thin film electrode layer preferably contains at least one metal selected from the group consisting of Mg, Al, Ti, W, Cr, Cu, Ni, Ag, Co, Mo and V. In this case, fixing strength of the external electrodes 15 to 17 to the capacitor main body 10 is able to be enhanced. The thin film electrode layer is preferably about 0.05 µm or more and about 1 µm or less in thickness, for example. The thin film electrode layer may be a single layer or may be a laminated body including a plurality of layers. The thin film electrode layer can be formed, for example, by a sputtering method or the like. In other words, the thin film electrode layer may be composed of a sputtering film.

The Cu plated layer covers the base electrode layer and the thin film electrode layer. The plated layer may be a single layer or a plurality of layers, but the outermost layer is the Cu plated layer. Since the outermost layer of plated layers is the Cu plated layer, it is possible to easily build the ceramic capacitor 1 in a substrate in embedding the ceramic capacitor 1 in a substrate. In this regard, to embed the ceramic capacitor 1 into a substrate, there is a need to provide via holes for electronic component connection in order to make the capacitor electrically continuous to the external electrodes 15 to 17, and the via holes for electronic component connection are formed with the use of a laser such as a $CO_2$ laser. When the via hole is formed using the laser, the external electrodes 15 to 17 of the ceramic capacitor 1 is directly irradiated with the laser. In this case, by making up the outermost layer of the external electrodes 15, 16, 17 of the Cu plated layer, the laser is able to be reflected at a high reflectivity. Accordingly, the ceramic capacitor 1 in which the outermost layer of plated layers is the Cu plated layer is able to be suitably used as a capacitor for being embedded in a substrate. If the external electrodes 15 to 17 have a low laser reflectance, the laser may reach the inside of the capacitor to damage the capacitor.

The plated layer is preferably about 1 µm or more and about 15 µm or less in thickness per layer, for example. A conductive resin layer for stress relaxation may be provided between the base electrode layer and the plated layer.

As shown in FIG. 2, in the present preferred embodiment, a thickness t1 of a portion disposed on the first or second principal surfaces 10a, 10b of the third external electrode 17 is smaller than thicknesses t2 of portions disposed on the first or second principal surfaces 10a, 10b of the first and second external electrodes 15, 16. As a result of this, when mounting the ceramic capacitor 1 to the substrate, a mounting nozzle of a surface mount machine is able to be prevented from abutting against only the third external electrode 17 and it also abuts against the first and second external electrodes 15, 16.

As a result of this, stress produced in suctioning the ceramic capacitor 1 with the mounting nozzle is able to be diffused. Accordingly, it is possible to prevent cracks or the like from being produced in the capacitor main body 10 beginning at ends of the external electrodes 15 to 17. That is, the reliability of the ceramic capacitor 1 is able to be improved.

It is preferred from the viewpoint of more effectively preventing the cracks from being produced in the capacitor main body 10 beginning at ends of the external electrodes 15 to 17 that differences between the thickness t1 of a portion disposed on the first or second principal surfaces 10a, 10b of the third external electrode 17 and the thicknesses t2 of portions disposed on the first or second principal surfaces 10a, 10b of the first and second external electrodes 15, 16, are about 0.5 µm or more, for example.

Figure 12:
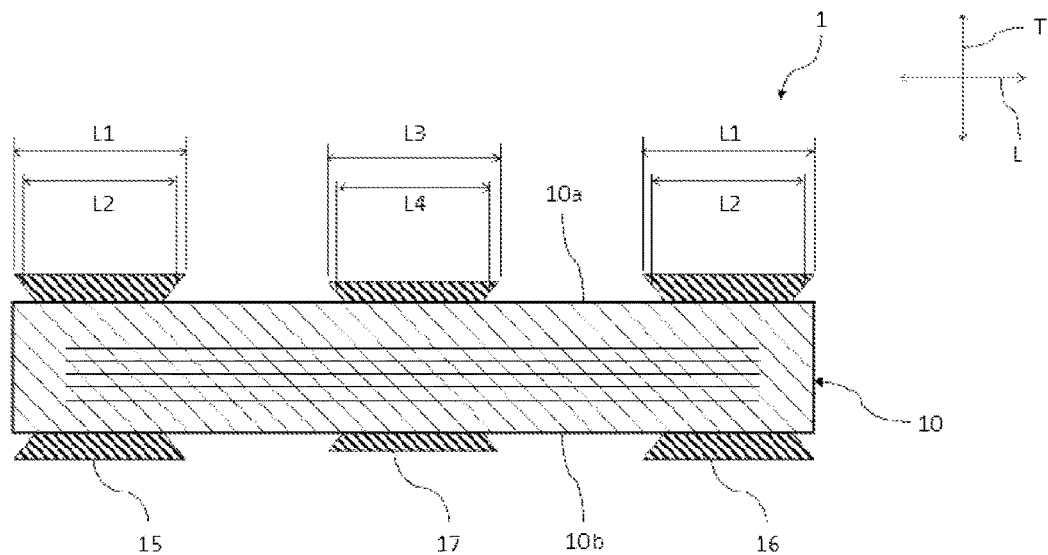
FIG. 12 is a schematic cross-sectional view of the capacitor of the first preferred embodiment of the present invention.

As shown in FIG. 12, in a ceramic capacitor according to a preferred embodiment of the present invention, when a maximum length in the length direction L, of portions of the first and second external electrodes 15, 16 located on the first or second principal surface 10a, 10b, is denoted by L1, whereas a maximum length of the first and second external electrodes 15, 16 in the length direction L from a portion farthest from the capacitor main body 10 in the laminating direction T, of the portions of the first and second external electrodes 15, 16 located on the first or second principal surface 10a, 10b, to a portion recessed to the capacitor main body 10 by about 40% of a thickness of the first or second external electrode 15, 16 in the laminating direction T is denoted by L2, a ratio L2/L1 is preferably about 80% or more and about 90% or less, for example.

According to this configuration, shocks to a ridge of the ceramic capacitor 1 at the time of mounting the ceramic capacitor 1 to a substrate are effectively diffused, and therefore breakages and cracks in mounting the ceramic capacitor 1 are significantly reduced or prevented. Further, since surface areas of flat portions of the first and second external electrodes 15, 16 are large, excellent electrical connection between the via hole electrode and the first and second external electrodes 15, 16 are able to be realized.

In addition, although the effect is achieved by setting L2/L1 to about 80% or more and about 90% or less in either of the first external electrode 15 or the second external electrode 16, it is more effective to set L2/L1 to about 80% or more and about 90% or less in both of the first external electrode 15 and the second external electrode 16, for example.

When a maximum length in the length direction L, of a portion of the third external electrode 17 located on the first or second principal surface 10a, 10b, is denoted by L3, whereas a maximum length in the length direction from a portion farthest from the capacitor main body 10 in the laminating direction T, of the portion of the third external electrode 17 located on the first or second principal surface 10a, 10b, to a portion recessed to the capacitor main body 10 by about 40% of a thickness of the third external electrode 17 in the laminating direction T is denoted by L4, a ratio L4/L3 is preferably 80% or more, for example.

According to this configuration, since surface areas of flat portions of the first and second external electrodes 15, 16 are large, excellent electrical connection between the via hole electrode and the first and second external electrodes 15, 16 is realized.

It is preferred that a relationship of L5>L6 holds when lengths in the length direction L of portions located on the first and second principal surfaces 10a, 10b of the third external electrode 17 are each denoted by L5, and lengths in the length direction L of portions located on the first and second side surfaces 10c, 10d of the third external electrode 17 are each denoted by L6. According to this configuration, areas of portions located on the first and second principal surfaces 10a, 10b of the third external electrode 17 are large. As a result of this, an area capable of being irradiated with laser light in order to form, in the ceramic capacitor 1-built in substrate, a via hole to face the third external electrode 17 of the ceramic capacitor 1, is able to be large. Accordingly, defective connection between the via hole electrode and the ceramic capacitor 1 is significantly reduced or prevented. Further, flexibility of a position of the via hole electrode is improved.

In the ceramic capacitor 1, width dimensions of portions located on the side surfaces 10c, 10d of the external electrodes 15, 16 are preferably smaller than width dimensions of portions located on the principal surfaces 10a, 10b of the external electrodes 15, 16. According to this configuration, an area of an exposed portion of the capacitor main body 10 which is high in adhesion to a substrate is able to be large. Therefore, the adhesion between the ceramic capacitor 1 and the substrate is improved. Therefore, it is possible to prevent the ceramic capacitor 1 from peeling off from a substrate resulting in moisture and the like infiltrating from a peeled portion. As a result of this, it is possible to significantly reduce or prevent the occurrence of short-circuiting between the first external electrode 15 and the second external electrode 16 resulting from migration.

It is preferred that a relationship of L7>L8 holds when lengths in the length direction L of portions located on the first and second principal surfaces 10a, 10b of the first and second external electrodes 15, 16 are each denoted by L7, and lengths in the length direction L of portions located on the first and second side surfaces 10c, 10d of the first and second external electrodes 15, 16 are each denoted by L8. According to this configuration, surface areas of portions located on the first and second principal surfaces 10a, 10b of the first and second external electrodes 15, 16 are large. As a result of this, an area capable of being irradiated with laser light in order to form, in the ceramic capacitor 1-built in substrate, a via hole to face the first and second external electrodes 15, 16 of the ceramic capacitor 1, is able to be large. Accordingly, defective connection between the via hole electrode and the ceramic capacitor 1 is significantly reduced or prevented. Further, flexibility of a position of the via hole electrode is able to be improved. Further, since widths of portions located on the first and second side surfaces 10c, 10d of the first and second external electrodes 15, 16 are smaller than widths of portions located on the first and second principal surfaces 10a, 10b of the first and second external electrodes 15, 16, an area of an exposed portion of the capacitor main body 10 which is high in adhesion to a substrate is able to be large. As a result of this, adhesion between the ceramic capacitor 1 and the substrate is improved. Therefore, it is possible to prevent the ceramic capacitor 1 from peeling off from a substrate resulting in moisture and the like infiltrating from a peeled portion. As a result of this, it is possible to significantly reduce or prevent the occurrence of short-circuiting between the first external electrode 15 and the second external electrode 16 resulting from migration.

In addition, L6/L5 is preferably about 0.77 to about 0.96, for example, when lengths in the length direction L of portions located on the first and second principal surfaces 10a, 10b of the third external electrode 17 are each denoted by L5, and lengths in the length direction L of portions located on the first and second side surfaces 10c, 10d of the third external electrode 17 are each denoted by L6. L8/L7 is preferably about 0.78 to about 0.96, for example, when lengths in the length direction L of portions located on the first and second principal surfaces 10a, 10b of the first and second external electrodes 15, 16 are each denoted by L7, and lengths in the length direction L of portions located on the first and second side surfaces 10c, 10d of the first and second external electrodes 15, 16 are each denoted by L8. According to these configurations, the above-mentioned effects are able to be more effectively achieved.

A thickness of a portion located on the first or second principal surfaces 10a, 10b of the third external electrode 17 is preferably smaller than thicknesses of portions located on the first or second principal surfaces 10a, 10b of the first and second external electrodes 15, 16. According to this configuration, when mounting the ceramic capacitor 1 to the substrate, stress is diffused since the mounting nozzle of the surface mount machine is prevented from abutting against only the third external electrode 17 positioned at a center in the length direction L and it can also abut against the first and second external electrodes 15, 16 on both sides of the external electrode 17. Therefore, it is possible to prevent cracks from being produced in the capacitor main body 10 beginning at the external electrodes 15 to 17.

It is preferred from the viewpoint of more effectively preventing the cracks from being produced in the capacitor main body 10 that differences between the thickness of a portion located on the first or second principal surfaces 10a, 10b of the third external electrode 17 and the thicknesses of portions located on the first or second principal surfaces 10a, 10b of the first and second external electrodes 15, 16, are about 0.5 μm or more and about 15 μm or less, for example.

As shown in FIG. 2, in the ceramic capacitor 1, when a dimension in the length direction of the lowermost surface of the third external electrode 17 which is in contact with the capacitor main body 10 is denoted by e1 and a dimension in the length direction of the uppermost surface of the third external electrode is denoted by e2, a relationship of e1<e2 is satisfied. Therefore, the defective connection to a via hole electrode in building the ceramic capacitor 1 in a substrate hardly occurs and the short-circuit due to electromigration is hardly caused. Accordingly, the ceramic capacitor 1 is suitable to be built into a substrate.

Also, when a dimension in the length direction of the lowermost surface of the first external electrode 15 which is in contact with the capacitor main body 10 is denoted by e3 and a dimension in the length direction of the uppermost surface of the first external electrode 15 is denoted by e4, a relationship of e3<e4 is satisfied. When a dimension in the length direction of the lowermost surface of the second external electrode 16 which is in contact with the capacitor main body 10 is denoted by e5 and a dimension in the length direction of the uppermost surface of the second external electrode 16 is denoted by e6, a relationship of e5<e6 is satisfied. Therefore, the defective connection to a via hole electrode in building the ceramic capacitor 1 in a substrate more hardly occurs and the short-circuit due to electromigration is more hardly caused. Accordingly, the ceramic capacitor 1 is more suitable to be built into a substrate.

In addition, the reason why the defective connection to a via hole electrode in building the ceramic capacitor 1 in a substrate hardly occurs by setting e1, e2, e3, e4, e5 and e6 to satisfy the relationships of e1<e2, e3<e4 and e5<e6, is supposedly that areas of contact between the via hole electrode and external electrodes 15 to 17 are able to be large by setting e1, e2, e3, e4, e5 and e6 to satisfy the relationships of e1<e2, e3<e4 and e5<e6, and a hard-to-occur defective connection is achieved by attaining the relationships e1<e2, e3<e4 and e5<e6.

The reason why the short-circuit due to electromigration is hardly caused in the ceramic capacitor built into a substrate by setting e1, e2, e3, e4, e5 and e6 to satisfy the relationships e1<e2, e3<e4 and e5<e6, is supposedly that a distance between the first or second external electrode 15, 16 and the third external electrode 17 on a surface of the capacitor main body 10 is able to be large. Further, when e1, e2, e3, e4, e5 and e6 are set to satisfy the relationships e1<e2, e3<e4 and e5<e6, an anchor effect is produced between the substrate and the external electrodes 15 to 17, and therefore the adhesion between the substrate and the external electrodes 15 to 17 is improved, and the ceramic capacitor 1 hardly peels off. Accordingly, being able to significantly reduce or prevent the moisture infiltration into the substrate is thought to similarly contribute to prevent the short-circuiting due to electromigration.

Each of (e2−e1), (e4−e3) and (e6−e5) is preferably about 24 μm or less from the viewpoint of more effectively significantly reducing or preventing the occurrence of the defective connection to a via hole electrode in building the ceramic capacitor 1 in a substrate and more effectively significantly reducing or preventing the occurrence of the short-circuit due to electromigration.

In addition, a cross-section shape of each of the external electrodes 15 to 17 is preferably such a shape that its width gradually becomes smaller toward the capacitor main body 10 side. In this case, such a cross section shape allows the above-mentioned effect to be more remarkable.

In the ceramic capacitor 1, the external electrodes 15 to 17 are not disposed on the first and second end surfaces 10e, 10f. As a result of this, an exposed area of the capacitor main body 10 which is excellent in the adhesion to a resin of the substrate, is large. Thus, the adhesion between the substrate and the ceramic capacitor 1 is high. Accordingly, it is possible to more effectively prevent the electromigration resulting from moisture infiltrating from a peeled portion after the ceramic capacitor is peeled off from a substrate.

Method for Manufacturing Ceramic Capacitor 1

Next, an example of a method for manufacturing the ceramic capacitor 1 will be described.

First, ceramic green sheets, a conductive paste for internal electrodes and a conductive paste for external terminal electrodes are each prepared. The ceramic green sheet and the conductive pastes may contain a binder and a solvent. For the binder and the solvent to be used for the ceramic green sheet and the conductive paste, publicly known ones can be used.

Next, onto the ceramic green sheets, the conductive paste is applied in predetermined patterns, for example, by a screen printing method or a gravure printing method, thus forming internal electrode patterns.

Then, the ceramic green sheets without any applied internal electrode pattern for external layers are laminated to reach a predetermined number of sheets, on the surface thereof, the ceramic green sheets with the applied internal electrode patterns are laminated in turn, and on the surface thereof, the ceramic green sheets for external layers are laminated to reach a predetermined number of sheets to prepare a mother laminated body. Thereafter, the mother laminated body is pressed in the laminating direction by a method such as isostatic press.

Then, a raw ceramic laminated body is cut out by cutting the mother laminated body into a predetermined size. In this regard, the raw ceramic laminated body may include ridges and corners rounded by barrel polishing or the like.

A base electrode paste is applied onto an exposed portion of the internal electrode exposed to a side surface of the raw ceramic laminated body cut into a predetermined size. An application method of the base electrode paste is not limited.

Examples of the application method of the base electrode paste include a roller transfer method and the like.

In addition, the roller transfer method preferably is the following method. An application roller of the roller transfer method may be made of an elastic body or may be made of metal. A groove is formed on a peripheral surface of the application roller. A base electrode paste is filled in the groove of the application roller, and the application roller travels on a side surface of a chip while abutting against the side surface of a chip, and thus, the base electrode paste is transferred to the chip side surface. In addition, the raw ceramic laminated body may be moved toward a rotation direction of the roller in synchronization with a rotation of the roller to transfer the paste. Further, an excessively transferred conductive paste may be removed by pressing a roller without being filled with the base electrode paste against an end surface of a chip after the transfer.

Next, the raw ceramic laminated body is fired to obtain a capacitor main body 10. The firing temperature is preferably, for example, about 900° C. or higher and about 1300° C. or lower, for example, depending on the ceramic materials and conductive materials to be used. Thereafter, the capacitor main body 10 may include ridges and corners rounded by barrel polishing of the capacitor main body 10 or the like.

Then, a thin film electrode layer is formed. First, the fired capacitor main body 10 provided with the base electrode layer is inserted into a dedicated mask jig for the formation of the thin film electrode layer. The mask jig is configured in a way that enables to expose only regions on which thin film electrode layers are desired to be formed. The capacitor main body 10 is supplied to a sputtering apparatus with only a region, on which external electrodes are desired to be formed, of a principal surface of the capacitor main body 10 exposed, and thin film electrode layers are formed on the predetermined regions of the capacitor main body 10 by a sputtering method or the like. For example, thin film electrode layers of two layers of a NiCr film and a NiCu film (thin film electrode layer contacting the capacitor main body 10) are formed.

Then, plated layers are formed on the thin film electrode layers to complete the external electrodes 15 to 17. The plated layer may be a single layer or may be a plurality of layers, but for the outermost layer, the Cu plated layer is used. The plated layer can be formed, for example, by an electrolytic plating method or an electroless plating method.

When the plated layer is formed by an electrolytic plating method, specifically, a plating bath filled with a plating solution, a cathode electrode and an anode electrode are prepared. A plating voltage is applied between the cathode electrode and the anode electrode in the plating solution, and a current is applied so that the cathode electrode is brought into contact with a sintered electrode layer formed on the capacitor main body 10. By doing so, the plated layer is deposited on the sintered electrode layer. In addition, a conductive media may be put in the plating bath together with the capacitor main body 10 to apply a current to the sintered electrode layer of the capacitor main body 10 through the conductive media. In addition, as a method of applying a current to the fired electrode layer, for example, a vibration plating method in which plating is performed by stirring the capacitor main body 10 and the conductive media by vibration, a rotation barrel plating method in which plating is performed while rotating/stirring the conductive media and the capacitor main body 10 put in a barrel, and a centrifugal plating method in which the capacitor main body 10 is stirred to be plated by a centrifugal force of the barrel, are preferably used.

Furthermore, as required, heat treatment and surface treatment of the external electrode are carried out. The external electrodes 15 to 17 are able to be made compact and reliability of the capacitor is improved by subjecting to heat treatment. Further, when the surfaces of the external electrodes 15 to 17 are surface treated, the surfaces of the external electrodes 15 to 17 are able to be roughened, and the adhesion between a resin of the substrate and the external electrodes 15 to 17 is improved in embedding the ceramic capacitor in a substrate for built-in of a component.

The ceramic capacitor 1 is able to be manufactured by the above-mentioned process steps.

In addition, the external electrodes 15 to 17 which satisfy the relationships of e1<e2, e3<e4, and e5<e6 are able to be formed, for example, by the following methods 1 to 3.

Method 1

First, a conductive paste for forming the base electrode layer is applied onto the whole surface of each of the principal surfaces 10a, 10b of the capacitor main body 10 and dried. Then, a resist is applied onto the conductive paste layer, and applied resist is exposed, developed and rinsed to form resist films corresponding to shapes of the first to third external electrodes 15 to 17. Thereafter, a portion which is exposed out of the resist film, of the conductive paste layer, is removed by performing etching. Next, a resist film is removed. Thereafter, the first to third external electrodes 15 to 17 are cut and machined, and thus the first to third external electrodes 15 to 17 which satisfy the relationships of e1<e2, e3<e4, and e5<e6 are able to be formed.

Method 2

First, a first conductive paste for forming the base electrode layer is applied onto the whole surface of each of the principal surfaces 10a, 10b of the capacitor main body 10 and dried, and thus a first conductive paste layer is formed. Then, a second conductive paste is applied onto the first conductive paste and dried to form a second conductive paste layer. Then, a resist is applied onto the conductive paste layer, and applied resist is exposed, developed and rinsed to form resist films corresponding to shapes of the first to third external electrodes 15 to 17. Thereafter, a portion which is exposed out of the resist film, of the conductive paste layer, is removed by performing etching. Next, the first to third external electrodes 15 to 17 are formed by removing a resist film.

In the method 2, such conductive pastes that an etching rate of the first conductive paste layer is higher than an etching rate of the second conductive paste layer are used as the first and second conductive pastes. Accordingly, by etching the first and second conductive paste layers, the first to third external electrodes 15 to 17 which satisfy the relationships of e1<e2, e3<e4, and e5<e6 are able to be formed.

In addition, in the method 2, an example of forming the conductive paste layer of two layers has been described. However, the present invention is not limited to this example. For example, a laminated body of three or more conductive paste layers may be formed.

Method 3

First, a conductive paste for forming the base electrode layer is applied onto the whole surface of each of the principal surfaces 10a, 10b of the capacitor main body 10 and dried. Then, a resist is applied onto the conductive paste layer, and applied resist is exposed, developed and rinsed to form resist films corresponding to shapes of the first to third external electrodes 15 to 17. Thereafter, a portion which is exposed out of the resist film, of the conductive paste layer, is removed by performing etching. Next, the first to third external electrodes 15 to 17 are formed by removing a resist film.

In the method 3, the conductive paste layer is over etched in an etching step. Accordingly, the first to third external electrodes 15 to 17 which satisfy the relationships of e1<e2, e3<e4, and e5<e6 are able to be formed.

Hereinafter, another example of a preferred embodiment of the present invention will be described. In the following description, a member having a function substantially common to that of the first preferred embodiment is denoted by the same symbol, and descriptions of the member will be omitted.

Second Preferred Embodiment

Figure 10:
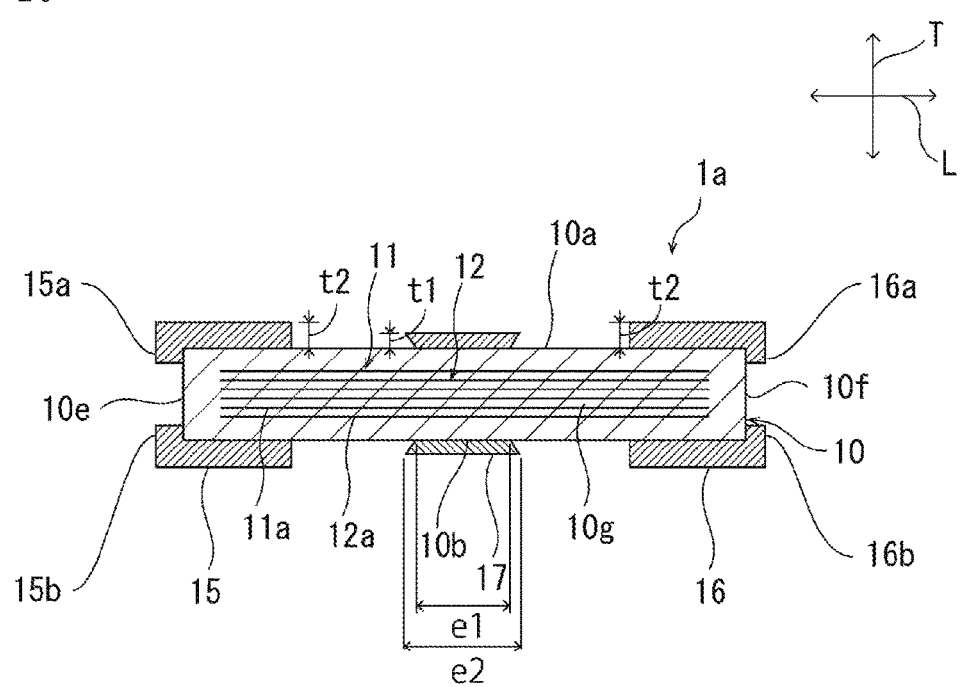
FIG. 10 is a schematic cross-sectional view of a capacitor of a second preferred embodiment of the present invention.
Figure 11:
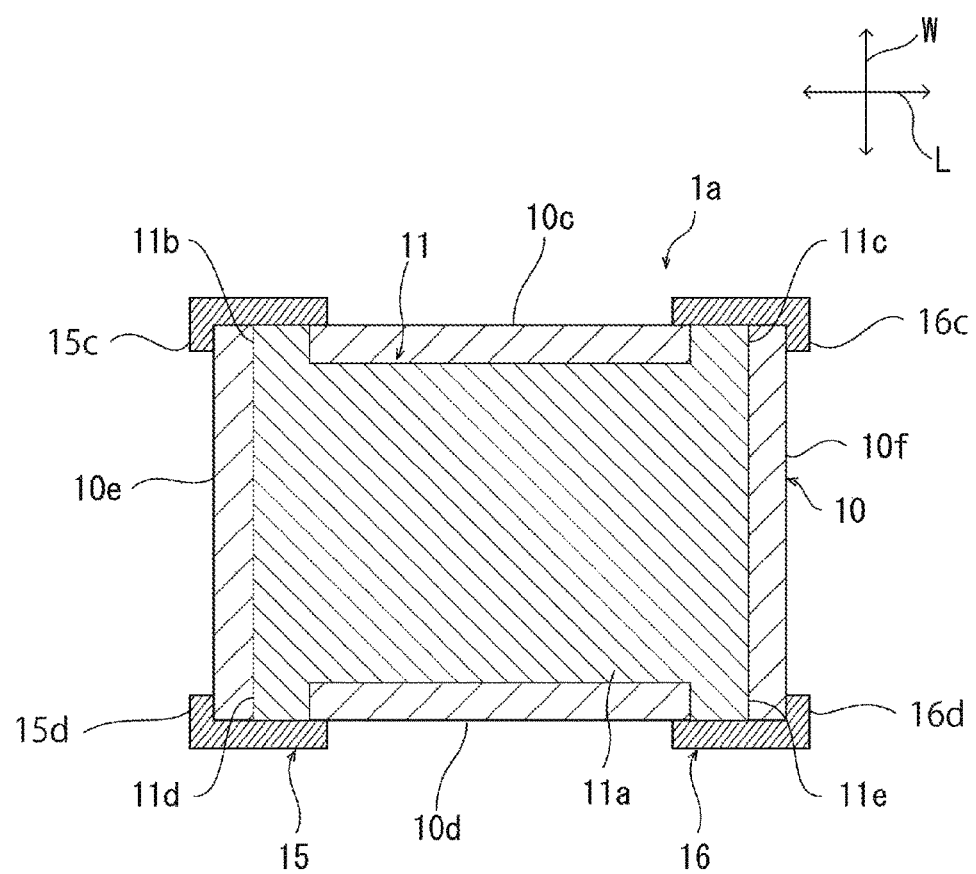
FIG. 11 is a schematic cross-sectional view of the capacitor of the second preferred embodiment of the present invention.

FIG. 10 is a schematic cross-sectional view of a capacitor of a second preferred embodiment of the present invention. FIG. 11 is a schematic cross-sectional view of a capacitor of the second preferred embodiment.

In the first preferred embodiment, an example in which the first and second external electrodes 15, 16 are not provided on the first and second end surfaces 10e, 10f, respectively, has been described. However, the present invention is not limited to this configuration.

For example, as shown in FIGS. 10 and 11, in a ceramic capacitor 1a, a first external electrode 15 extends over the first and second principal surfaces 10a, 10b/the first and second side surfaces 10c, 10d and portion of the first end surfaces 10e. The first external electrode 15 includes a first portion 15a, a second portion 15b, a third portion 15c, and a fourth portion 15d.

The first portion 15a extends from a portion located on the first principal surface 10a to a portion of the first end surface 10e. Therefore, the first portion 15a covers a ridge of the capacitor main body 10 which the first principal surface 10a defines with the first end surface 10e.

The second portion 15b extends from a portion located on the second principal surface 10b onto the first end surface 10e. Therefore, the second portion 15b covers a ridge of the capacitor main body 10 which the second principal surface 10b defines with the first end surface 10e. The second portion 15b is not directly connected to the first portion 15a. Therefore, the first end surface 10e is exposed between the first portion 15a and the second portion 15b.

The third portion 15c extends from a portion located on the first side surface 10c to a portion of the first end surface 10e. Therefore, the third portion 15c covers a ridge of the capacitor main body 10 which the first side surface 10c defines with the first end surface 10e.

The fourth portion 15d extends from a portion located on the second side surface 10d to a portion of the first end surface 10e. Therefore, the fourth portion 15d covers a ridge of the capacitor main body 10 which the second side surface 10d defines with the first end surface 10e. The fourth portion 15d is not directly connected to the third portion 15c. Therefore, the first end surface 10e is exposed between the third portion 15c and the fourth portion 15d.

A second external electrode 16 extends over the first and second principal surfaces 10a, 10b/the first and second side surfaces 10c, 10d and portion of the second end surfaces 10f. The second external electrode 16 includes a fifth portion 16a, a sixth portion 16b, a seventh portion 16c, and an eighth portion 16d.

The fifth portion 16a extends from a portion located on the first principal surface 10a to a portion of the second end surface 10f. Therefore, the fifth portion 16a covers a ridge of the capacitor main body 10 which the first principal surface 10a defines with the second end surface 10f.

The sixth portion 16b extends from a portion located on the second principal surface 10b onto the second end surface 10f. Therefore, the sixth portion 16b covers a ridge of the capacitor main body 10 which the second principal surface 10b defines with the second end surface 10f. The sixth portion 16b is not directly connected to the fifth portion 16a. Therefore, the second end surface 10f is exposed between the fifth portion 16a and the sixth portion 16b.

The seventh portion 16c extends from a portion located on the first side surface 10c onto the second end surface 10f. Therefore, the seventh portion 16c covers a ridge of the capacitor main body 10 which the first side surface 10c defines with the second end surface 10f.

The eighth portion 16d extends from a portion located on the second side surface 10d onto the second end surface 10f. Therefore, the eighth portion 16d covers a ridge of the capacitor main body 10 which the second side surface 10d defines with the second end surface 10f. The eighth portion 16d is not directly connected to the seventh portion 16c. Therefore, the second end surface 10f is exposed between the seventh portion 16c and the eighth portion 16d.

As described above, in the ceramic capacitor 1a, the first portion to the fourth portion 15a to 15d of the first external electrode 15 cover ridges which the first end surface 10e of the capacitor main body 10 defines with first and second principal surfaces 10a, 10b, respectively, and with the first and second side surfaces 10c, 10d, respectively. The fifth portion to the eighth portion 16a to 16d of the second external electrode 16 cover ridges which the second end surface 10f of the capacitor main body 10 defines with first and second principal surfaces 10a, 10b, respectively, and with the first and second side surfaces 10c, 10d, respectively. Accordingly, the ridges of the capacitor main body 10 are protected by the first and second external electrodes 15, 16. Thus, even if shocks and stress from outside are applied to the ceramic capacitor 1, damage to the capacitor main body 10 is significantly reduced or prevented. Accordingly, the ceramic capacitor 1a has excellent reliability.

In the ceramic capacitor 1a, the first external electrode 15 does not cover the entire surface of the first end surface 10e, and the second external electrode 16 does not cover the entire surface of the second end surface 10f. The first and second end surfaces 10e, 10f are each partially exposed. Thus, the adhesion strength between the ceramic capacitor 1a and the substrate is able to be enhanced in building the ceramic capacitor 1a in the substrate. Accordingly, it is possible to significantly reduce or prevent the infiltration of the moisture or the like into a capacitor built-in substrate. Thus, even in the case of being built into the substrate, the ceramic capacitor 1a has excellent reliability.

In the ceramic capacitor 1a, lengths of the first and second portions 15a, 15b of the first external electrode 15, and of the fifth and sixth portions 16a, 16b of the second external electrode 16 in the laminating direction T are each about 5% or more and about 15% or less of a dimension of the ceramic capacitor 1 in the laminating direction T, for example. Lengths of the third and fourth portions 15c, 15d of the first external electrode 15, and of the seventh and eighth portions 16c, 16d of the second external electrode 16 in the laminating direction T are each about 5% or more and about 15% or less of a width dimension of the ceramic capacitor 1, for example. As a result of this, the surface of the capacitor main body 10 which has a higher adhesion force to a substrate than the surfaces of the external electrodes 15, 16, is able to be exposed in an optimum range. Thus, the adhesion to the substrate is able to be improved in building the ceramic capacitor 1 in the substrate. Further, since the ridges of the capacitor main body 10 are able to be protected by the external electrodes 15, 16, the ceramic capacitor 1 is less likely to be broken or cracked. And, when the length each of the third and fourth portions 15c, 15d of the first external electrode 15 and the seventh and eighth portions 16c, 16d of the second external electrode 16 is set to a preferred range, dimensions of external electrodes 15, 16 in the length direction L of the ceramic capacitor 1 are also able to be controlled. Thus, the ceramic capacitor 1 hardly causes defects in inserting and mounting the ceramic capacitor 1 in a cavity of the substrate, and mounting error of the ceramic capacitor 1 hardly occurs.

In the ceramic capacitor 1a, lengths of the first and second portions 15a, 15b of the first external electrode 15, and of the fifth and sixth portions 16a, 16b of the second external electrode 16 in the laminating direction T are each preferably about 8% or more and about 12% or less of a dimension of the ceramic capacitor 1 in the laminating direction T, for example. The above-mentioned effect is more remarkable by setting the above-mentioned dimensions to this range.

In addition, the length in the laminating direction T of each of the first, second, fifth and sixth portions 15a, 15b, 16a, 16b is preferably shorter than the length in the width direction W of the third, fourth, seventh and eighth portions 15c, 15d, 16c, 16d. According to this configuration, it is possible to control not only the first, second, fifth and sixth portions 15a, 15b, 16a, 16b but also thicknesses of the external electrodes 15, 16 in the laminating direction T, and therefore the ceramic capacitor 1 are able to be thin. Thus, it is possible to make the ceramic capacitor 1 more suitable to be mounted in the built-in electronic component substrate.

Preferred embodiments of the present invention will be described in more detail below based on specific examples, but the present invention is not limited to the following Examples, and variations and modifications may be appropriately made without departing from the gist of the present invention.

EXAMPLE 1

A plurality of capacitors having the substantially same constitution as in the ceramic capacitor 1 of the first preferred embodiment were prepared as samples of a ceramic capacitor under the following conditions using the production method described in the first preferred embodiment.
Conditions:
Dimension of a ceramic capacitor (standard dimension): L×W×T=1.000 mm×0.600 mm×0.220 mm
  Ceramic material: $BaTi_2O_3$
  Capacitance: 1 μF
  Rated voltage: 6.3 V
  Structure of an external electrode: Base electrode layer/thin film electrode layer/plated layer
  Base electrode layer: Ni fired electrode layer
  Thin film electrode layer: NiCr sputtering film/NiCu sputtering film
  Plated layer: one Cu plated layer
  Thickness of Base electrode layer (central portion): 6 μm
  Thickness of a thin film electrode layer (central portion): total 0.3 μm (each layer 0.15 μm)
  Thickness of a plated layer (central portion): 10 μm
  e1: 230 μm
  e2: 250 μm
  e3: 230 μm
  e4: 250 μm
  e5: 280 μm
  e6: 300 μm
In addition, e1 to e6 were measured in the following manner.

First, a side surface of the ceramic capacitor was polished until a dimension in a width direction of the ceramic capacitor was reduced to a half to expose a cross section of the ceramic capacitor. By observing the cross section using an optical microscope, e1 to e6 were measured.

COMPARATIVE EXAMPLE 1

Samples of a plurality of ceramic capacitors were prepared in the same manner as in Example 1 except that e1 and e2 were changed to 230 μm, e3 and e4 were changed to 230 μm, and e5 and e6 were changed to 280 μm.

COMPARATIVE EXAMPLE 2

Samples of a plurality of ceramic capacitors were prepared in the same manner as in Example 1 except for changing e1 to e6 to e1 (250 μm)>e2 (230 μm), e3 (250 μm)>e4 (230 μm) and e5 (300 μm) >e6 (280 μm).
Evaluation of Connectivity to Via Hole Electrode Each of the ceramic capacitors prepared in Examples and Comparative Examples was embedded in a substrate to prepare a ceramic capacitor built-in substrate. Next, a side surface of the ceramic capacitor built-in substrate was polished until a center in a planar view of the via hole electrode was exposed. The cross section was observed using a metallurgical microscope (MM-60 manufactured by NIKON CORPORATION), and a sample in which the via hole electrode is connected to the external electrode in all of the first external electrode to the third external electrode is rated as a good-quality product, and a sample in which at least one via hole electrode is not connected to the external electrode is rated as a defective product and the number of the defective products was counted. The results are shown in Table 1.
Evaluation of Migration Each of the ceramic capacitors prepared in Examples and Comparative Examples was built into a glass epoxy substrate to prepare a ceramic capacitor built-in substrate. Then, the prepared ceramic capacitor built-in substrate was placed in a high-temperature and high-humidity tank at about 125° C., relative humidity of about 95% RH, and a voltage of about 6.3 V was applied to the ceramic capacitor over 144 hours. As a result of this, the sample with an insulation resistance value (IR value) decreased by two or more orders of magnitude was extracted. The extracted sample was polished until the surface of the capacitor main body was exposed. By observing the surface, the sample in which a deposited substance of a metal component of the external electrode was found between the external electrodes was rated as a defective product and the number of the defective products was counted. The results are shown in Table 1.

TABLE 1

|  | Number of Products with Defective Connection to Via Hole Electrode/ Number of Samples | Number of Migration Defective Products/Number of Samples |
| --- | --- | --- |
| Example | 0/50 | 0/50 |
| Comparative Example 1 | 2/50 | 3/50 |
| Comparative Example 2 | 5/50 | 5/50 |

It was discovered from the results shown in Table 1 that the occurrence of the defective connection of a via hole electrode or the occurrence of the migration is able to be more significantly reduced or prevented by setting e1 and e2 so as to satisfy the relationships e1<e2 than the case of setting e1 and e2 so as to satisfy the relationships e1≥e2.

EXAMPLES 2 TO 8

A plurality of capacitors having the substantially same constitution as in the ceramic capacitor 1 of the first preferred embodiment were prepared as samples of a ceramic capacitor under the following conditions using the production method described in the first preferred embodiment.
Conditions:
  Dimension of a ceramic capacitor (standard dimension): L×W×T=1.000 mm×0.600 mm×0.220 mm
  Ceramic material: $BaTi_2O_3$
  Capacitance: 1 µF
  Rated voltage: 6.3 V
  Structure of an external electrode: Base electrode layer/thin film electrode layer/plated layer
  Base electrode layer: Ni fired electrode layer
  Thin film electrode layer: NiCr sputtering film/NiCu sputtering film
  Plated layer: one Cu plated layer
  Thickness of Base electrode layer (central portion): 6 µm
  Thickness of a thin film electrode layer (central portion): total 0.3 µm (each layer 0.15 µm)
  Thickness of a plated layer (central portion): 10 µm
  e2: 250 µm
  e4: 250 µm
  e6: 300 µm
Evaluation of Migration
  Evaluation of migration was also carried out on the samples prepared in Examples 2 to 8 by the above-mentioned method.
  The results are shown in Table 2.
Evaluation of Cracks of External Electrode
  The ceramic capacitors prepared in each of Examples 2 to 8 was built into a glass epoxy substrate to prepare a ceramic capacitor built-in substrate. Next, a side surface of the ceramic capacitor built-in substrate was polished to expose a cross section of the ceramic capacitor. Thereafter, the cross section of the ceramic capacitor was observed using a metallurgical microscope in each polishing while polishing the side surface little by little to verify whether a crack was produced or not in the external electrodes of the ceramic capacitor. A sample in which the crack was produced was rated as a defective product and the number of the defective products was counted. The results are shown in Table 2.

It was discovered from the results shown in Table 2 that the migration is able to be more effectively reduced or prevented and the occurrence of the cracks in the external electrodes are able to be more effectively reduced or prevented by setting each of (e2−e1), (e4−e3) and (e6−e5) to 24 µm or less.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A ceramic capacitor comprising:
  a capacitor main body including first and second principal surfaces extending in a length direction and a width direction perpendicular or substantially perpendicular to the length direction, first and second side surfaces extending in the length direction and a laminating direction perpendicular or substantially perpendicular to each of the length direction and the width direction, and first and second end surfaces extending in the width direction and the laminating direction;
  a plurality of internal electrodes disposed in the capacitor main body, and exposed at each of the first and second side surfaces; and
  a plurality of external electrodes extending from exposed portions of the internal electrodes at the first side surface and exposed portions of the internal electrodes at the second side surface to the first and second principal surfaces; wherein
  each of the plurality of internal electrodes includes:
    a first internal electrode; and
    a second internal electrode opposed to the first internal electrode in the laminating direction;
  each of the plurality of external electrodes includes:
    a first external electrode connected to the first internal electrode and wrapping around the first side surface, the first principal surface, the second side surface, and the second principal surface;
    a second external electrode connected to the first internal electrode and wrapping around the first side surface, the first principal surface, the second side surface, and the second principal surface; and

TABLE 2

|  | e1 [µm] | e3 [µm] | e5 [µm] | e2 − e1 [µm] | e4 − e3 [µm] | e6 − e5 [µm] | Number of Migration Defective Products/ Number of Samples | Number of Crack Defective Products/ Number of Samples |
|---|---|---|---|---|---|---|---|---|
| Example 2 | 224 | 224 | 274 | 26 | 26 | 26 | 0/50 | 1/50 |
| Example 3 | 226 | 226 | 276 | 24 | 24 | 24 | 0/50 | 0/50 |
| Example 4 | 228 | 228 | 278 | 22 | 22 | 22 | 0/50 | 0/50 |
| Example 5 | 230 | 230 | 280 | 20 | 20 | 20 | 0/50 | 0/50 |
| Example 6 | 232 | 232 | 282 | 18 | 18 | 18 | 0/50 | 0/50 |
| Example 7 | 234 | 234 | 284 | 16 | 16 | 16 | 0/50 | 0/50 |
| Example 8 | 236 | 236 | 286 | 14 | 14 | 14 | 1/50 | 0/50 | a third external electrode connected to the second internal electrode and wrapping around the first side surface, the first principal surface, the second side surface, and the second principal surface;

the third external electrode being located between the first external electrode and the second external electrode in the length direction;

a dimension in the length direction of a lowermost surface of the third external electrode which is in contact with the capacitor main body on at least one of the first and second principal surfaces is e1;

a dimension in the length direction of an uppermost surface of the third external electrode is e2;

a relationship of e1<e2 is satisfied; and the plurality of internal electrodes extend in parallel or substantially in parallel with the first and second principal surfaces of the capacitor main body.

2. The ceramic capacitor according to claim 1, wherein each of the first and second external electrodes is not disposed on the first and second end surfaces;

a dimension in the length direction of a lowermost surface of the first external electrode which is in contact with the capacitor main body is e3;

a dimension in the length direction of an uppermost surface of the first external electrode is e4;

a dimension in the length direction of a lowermost surface of the second external electrode which is in contact with the capacitor main body is e5;

a dimension in the length direction of an uppermost surface of the second external electrode is e6;

a relationship of e3<e4 is satisfied; and a relationship of e5<e6 is satisfied.

3. The ceramic capacitor according to claim 1, wherein the first internal electrode includes:

a first opposed portion opposed to the second internal electrode;

first and second extended portions connected to the first opposed portion, and each extended to the first side surface and connected to the first external electrode; and third and fourth extended portions connected to the first opposed portion, and each extended to the second side surface and connected to the second external electrode; and the second internal electrode includes:

a second opposed portion opposed to the first opposed portion;

a fifth extended portion connected to the second opposed portion, extended to the first side surface and connected to the third external electrode; and a sixth extended portion connected to the second opposed portion, extended to the second side surface and connected to the third external electrode.

4. The ceramic capacitor according to claim 1, wherein an outermost layer of each of the first, second and third external electrodes includes a Cu plated layer.

5. The ceramic capacitor according to claim 2, wherein each of (e2−e1), (e4−e3) and (e6−e5) is about 24 μm or less.

6. The ceramic capacitor according to claim 1, wherein the first external electrode includes:

a first portion extending from a portion located on the first principal surface to a portion of the first end surface;

a second portion extending from a portion located on the second principal surface to a portion of the first end surface;

a third portion extending from a portion located on the first side surface to a portion of the first end surface; and a fourth portion extending from a portion located on the second side surface to a portion of the first end surface; and the second external electrode includes:

a fifth portion extending from a portion located on the first principal surface to a portion of the second end surface;

a sixth portion extending from a portion located on the second principal surface to a portion of the second end surface;

a seventh portion extending from a portion located on the first side surface to a portion of the second end surface; and an eighth portion extending from a portion located on the second side surface to a portion of the second end surface;

lengths of the first and second portions, and lengths of the fifth and sixth portions in the laminating direction are each about 5% or more and about 15% or less of a dimension of the ceramic capacitor in the laminating direction; and lengths of the third and fourth portions, and lengths of the seventh and eighth portions in the laminating direction are each about 5% or more and about 15% or less of a width dimension of the ceramic capacitor.

7. The ceramic capacitor according to claim 6, wherein respective lengths of the first, second, fifth, and sixth portions in the laminating direction are smaller than lengths of the third, fourth, seventh, and eighth portions in the width direction.

8. The ceramic capacitor according to claim 1, wherein a length of a portion of the third external electrode located on the first or second principal surface in the length direction is larger than a length of a portion of the third external electrode located on the first or second side surface in the length direction.

9. The ceramic capacitor according to claim 1, wherein a length of a portion of the first external electrode located on the first or second principal surface in the length direction is larger than a length of a portion of the first external electrode located on the first and second side surfaces in the length direction; and a length of a portion of the second external electrode located on the first or second principal surface in the length direction is larger than a length of a portion of the second external electrode located on the first and second side surfaces in the length direction.

10. The ceramic capacitor according to claim 1, wherein a maximum length of the first and second external electrodes located on the first or second principal surface in the length direction, is L1;

a maximum length of the first and second external electrodes in the length direction from a portion farthest from the capacitor main body in the laminating direction, of the first and second external electrodes located on the first or second principal surface, to a portion retreated to the capacitor main body by about 40% of a thickness of the first or second external electrode in the laminating direction is L2;

a ratio L2/L1 is about 80% or more and about 90% or less; and a maximum length of the third external electrode located on the first or second principal surface in the length direction, is L3;

a maximum length of the third external electrode in the length direction from a portion farthest from the capacitor main body in the laminating direction, of the third external electrode located on the first or second principal surface, to a portion retreated to the capacitor main body by about 40% of a thickness of the third external electrode in the laminating direction is L4;

a ratio L4/L3 is about 80% or more.

11. The ceramic capacitor according to claim 1, wherein the capacitor main body has a cuboid or substantially cuboid shape.

12. The ceramic capacitor according to claim 1, wherein
a width dimension of the ceramic capacitor is denoted as DW;
a height dimension is of the ceramic capacitor denoted as DT;
a length dimension is of the ceramic capacitor denoted as DL;
DW, DT and DL satisfy following relationships:
DT<DW<DL; and
(about 1/7) DW≤DT≤(about 1/3) DW.

13. The ceramic capacitor according to claim 1, wherein
a width dimension of the ceramic capacitor is denoted as DW;
a height dimension of the ceramic capacitor is denoted as DT;
a length dimension of the ceramic capacitor is denoted as DL;
DW, DT and DL satisfy following relationships:
0.05 mm≤DT<about 0.25 mm;
about 0.4 mm<DL<about 1 mm; and
about 0.3 mm<DW<about 0.5 mm.

14. The ceramic capacitor according to claim 1, wherein a dimension of the ceramic capacitor in the laminating direction is about 1/5 times or more and about 1/2 times or less as large as the width dimension.

15. The ceramic capacitor according to claim 1, wherein a ceramic portion between adjacent ones of the plurality of internal electrodes is about 0.5 μm or more and about 10 μm or less in thickness.

16. The ceramic capacitor according to claim 1, wherein each of the plurality of internal electrodes has a thickness of about 0.2 μm or more and about 2 μm or less.

17. The ceramic capacitor according to claim 1, wherein each of the plurality of external electrodes has a thickness of about 190 μm or more and about 270 μm or less.

18. The ceramic capacitor according to claim 1, wherein the capacitor main body includes a plurality of via holes that are electrically continuous with the plurality of external electrodes.

19. The ceramic capacitor according to claim 6, wherein
the first portion covers a ridge of the capacitor main body which the first principal surface defines with the first end surface;
the second portion covers a ridge of the capacitor main body which the second principal surface defines with the first end surface;
the third portion covers a ridge of the capacitor main body which the first side surface defines with the first end surface;
the fourth portion covers a ridge of the capacitor main body which the second side surface defines with the first end surface.

20. The ceramic capacitor according to claim 6, wherein
the fifth portion covers a ridge of the capacitor main body which the first principal surface defines with the second end surface;
the sixth portion covers a ridge of the capacitor main body which the second principal surface defines with the second end surface;
the seventh portion covers a ridge of the capacitor main body which the first side surface defines with the second end surface;
the eighth portion covers a ridge of the capacitor main body which the second side surface defines with the second end surface.

* * * * *